(12) United States Patent
Tsuchiya

(10) Patent No.: US 6,654,099 B2
(45) Date of Patent: Nov. 25, 2003

(54) SCANNING EXPOSURE APPARATUS, SCANNING EXPOSURE METHOD AND MASK

(75) Inventor: Makoto Tsuchiya, Yokohama (JP)

(73) Assignee: Nikon Corporation, Tokyo (JP)

(*) Notice: Subject to any disclaimer, the term of this patent is extended or adjusted under 35 U.S.C. 154(b) by 118 days.

(21) Appl. No.: 09/765,295

(22) Filed: Jan. 22, 2001

(65) Prior Publication Data
US 2002/0159041 A1 Oct. 31, 2002

(30) Foreign Application Priority Data
Jan. 27, 2000 (JP) .................................. 2000-019179

(51) Int. Cl.$^7$ .................. G03B 27/42; G03B 27/52; G03B 27/32; A61N 5/00
(52) U.S. Cl. .................. 355/53; 355/55; 355/77; 250/492.2
(58) Field of Search .................. 355/53, 55, 67, 355/77; 356/399, 400, 401; 250/491.1, 492.2

(56) References Cited

U.S. PATENT DOCUMENTS

| 5,528,118 A | 6/1996 | Lee |
| 5,623,853 A | 4/1997 | Novak et al. |
| 5,625,436 A | 4/1997 | Yanagihara et al. |
| 5,729,331 A | 3/1998 | Tanaka et al. |
| 5,874,820 A | 2/1999 | Lee |
| 6,049,372 A | 4/2000 | Kato et al. |

FOREIGN PATENT DOCUMENTS

| JP | 7-57986 | 3/1995 |
| JP | 8-184113 | 7/1996 |
| JP | 8-320224 | 12/1996 |
| JP | 10-284416 | 10/1998 |
| JP | 11-132762 | 5/1999 |

Primary Examiner—Russell Adams
Assistant Examiner—Peter B. Kim
(74) Attorney, Agent, or Firm—Oliff & Berridge PLC

(57) ABSTRACT

A scanning exposure apparatus in which a mask and a substrate are moved in a first direction while images of patterns of the mask are exposed onto the substrate includes at least a pair of projection optical systems that are spaced from each other in the first direction by a predetermined distance. The pair of projection optical systems also are displaced from each other in a second direction that is perpendicular to the first direction such that at least portions of projection areas where the images of the pattern are projected by the pair of projection optical systems onto the substrate overlap each other. The scanning exposure apparatus also includes a shifter that shifts the images of the overlapping projection areas on the substrate in the second direction. This enables the measurement of the flatness tolerance of long planar mirrors that are used in controlling the positions of the mask and the substrate to be easily made. Consequently, this reduces the cost of the exposure apparatus by reducing the number of measurement axes of the interferometers that are used with the long mirrors.

29 Claims, 9 Drawing Sheets

SCANNING EXPOSURE APPARATUS, SCANNING EXPOSURE METHOD AND MASK

INCORPORATION BY REFERENCE

The disclosure of the following priority application is herein incorporated by reference in its entirety: Japanese Patent Application No. 2000-19179 filed Jan. 27, 2000.

BACKGROUND OF THE INVENTION

1. Field of Invention

The present invention relates to a mask having patterns that are projected by a pair of projection optical systems, and to scanning type exposure apparatus and scanning exposure methods that simultaneously move the mask and a substrate in a predetermined (scanning) direction and that expose images of the patterns formed on the mask onto the substrate.

2. Description of Related Art

In recent years, the use of liquid crystal display panels as a display device of personal computers and televisions, e.g., is rapidly increasing. Such liquid crystal display panels are produced by patterning thin film transparent electrodes, in a desired shape using photolithography techniques, onto a photosensitive substrate having a flat rectangular shape. For such photolithography apparatus, an exposure apparatus is used for exposing images of patterns formed on the mask (reticle) onto the photoresist layer of a photosensitive substrate through projection optical systems.

Meanwhile, efforts are being made to enlarge the aforementioned liquid crystal display panels to provide improved viewing quality. Some scanning type exposure apparatus are known to meet the need for enlargement of the display. Such an apparatus is disclosed in Japanese Laid Open Patent Publication No. 7-57986 (and in U.S. Pat. No. 5,729,331), which has a plurality of projection optical systems that project images of patterns of the mask onto a glass plate substrate as an erect image, while simultaneously moving the mask and the substrate in a predetermined (scanning) direction. Due to the use of the plurality of projection optical systems, this apparatus has a large exposure area in the direction perpendicular to the scanning direction, and sequentially transfers patterns such as an LCD (liquid crystal display) pattern that is formed on the mask onto the exposure area of the glass plate substrate.

In order to achieve a large projection area and superior imaging characteristics without requiring a large projection optical system, the exposure apparatus includes a plurality of (smaller) projection optical systems arranged in such a manner that the projection areas of adjacent projection optical systems are displaced by a predetermined amount in the scanning direction, and also are spaced from each other in the direction perpendicular to the scanning direction such that edge sections of each adjacent projection area overlap in the direction perpendicular to the scanning direction. In this case, a field stop of each projection optical system has a trapezoidal shape and is designed in such a manner that the sum of the aperture width of the field stops in the scanning direction is always equal. For this reason, a scanning exposure apparatus such as described above has a merit in that the portions of exposure areas of the adjacent projection optical systems which join each other are exposed overlappingly, and therefore optical aberration as well as exposure illuminance (exposure light-intensity) change gradually.

In this type of scanning exposure apparatus, in order to control with a high degree of accuracy, the relationship between relative positions of a mask and a substrate during scanning exposure, the relative positions and postures of the mask and the substrate are monitored using a plurality of position measuring instruments such as laser interferometers. These instruments measure the relative position shift of a mask stage which holds the mask and a substrate stage which holds the substrate with respect to the scanning direction (X direction) and with respect to the non-scanning direction (Y direction), which is perpendicular to the scanning direction. The instruments also measure the relative angle shift of the exposure beam with respect to the optical axis (Z direction).

Of these relative position shifts, the relative position shift with respect to the Y direction is obtained by providing long reflection mirrors that extend in the scanning direction (hereafter long mirrors) for the mask stage and for the substrate stage, and by measuring, with interferometers, respective displacement between each stage and its corresponding reflection mirror. In this way, the long mirrors serve as a reference in measuring relative position shift with respect to the Y direction. However, the production cost of long mirrors increases sharply because a high flatness tolerance must be maintained for the entire scanning length of each long mirror.

For this reason, a technology such as disclosed in Japanese Laid Open Patent Publication No. 8-184113 aims to execute scanning exposure without requiring strict flatness tolerance of the long mirrors by ignoring the relative position shift of the mask and the substrate in the Y direction. However, this technology fails when the long mirrors have a waviness with a short period.

Technologies such as disclosed in Japanese Laid Open Patent Publications Nos. 10-284416 and 11-132762 attempt to resolve the aforementioned inconvenience. In these publications, in addition to interferometers that respectively measure the displacement of each stage relative to its corresponding long mirror, a differential type of interferometer is provided for measuring, through long mirrors, relative position shift of the mask stage and the substrate stage in the Y direction. A flatness tolerance of each long mirror is determined by displacing each stage in the X direction and then taking measurements for each stage using each long mirror at two separated locations in the X direction. Based on the result of these measurements, the relative position shift between the mask and the glass plate is corrected.

However, conventional scanning exposure apparatus and scanning exposure method have the following problems. Interferometers are expensive, and due to the requirement to separately install differential interferometers for measuring relative position shifts, in the Y direction, between mask stages and substrate stages at a plurality of positions that are separated in the X direction, costs increase, which has become a problem that cannot be ignored in recent years due to the strong demand for cost reduction.

SUMMARY OF THE INVENTION

In view of the aforementioned problems, it is an object of the invention to provide a scanning exposure apparatus, a scanning exposure method and a mask that contribute to cost reduction by reducing the number of measurement axes of the interferometer(s) required to measure the flatness tolerance of long mirrors.

In order to achieve the above and/or other objects, one aspect of the invention relates to a scanning exposure apparatus in which a mask and a substrate such as, e.g., a plate, are moved along a first direction (a scanning direction) to expose a pattern of the mask onto the substrate. The scanning exposure apparatus preferably includes at least a pair of projection optical systems spaced a predetermined distance from each other in the first direction and displaced from each other in a second direction, which is perpendicular to the first direction, such that at least a portion of projection areas where the patterns are projected by the projection optical systems onto the substrate overlap each other. In addition, a shifter is provided to shift images of the overlapping exposure patterns on the substrate along the second direction.

A scanning exposure method according to one aspect of the invention includes the steps of simultaneously moving a mask and a substrate along a first direction while exposing an image of a pattern of the mask onto the substrate. The method further comprises a step of, during exposure to the substrate using a pair of projection optical systems that are spaced from each other in the first (X) direction by a predetermined distance and displaced from each other in a second (Y) direction perpendicular to the first direction such that at least a portion of projection areas where the patterns are projected onto the substrate by the pair of projection optical systems overlap, shifting the overlapping exposure patterns on the substrate along the second direction.

In the scanning exposure apparatus and the scanning exposure method of this aspect of the invention, the mask is positioned in such a manner that a pattern is scanned in the area where the projection areas of the pair of projection optical systems overlap. In addition, when the mask and the substrate are moved along the first direction (X direction), based on respective displacement measured using the long mirrors, after the shifter shifts the imaging position of one of the projection optical systems in the pair of projection optical systems along the second direction (Y direction), the image of the pattern projected by the shifted projection optical system is shifted relative to the image projected by the other projection optical system, and are separated in the second direction (Y direction).

In this process, each projected image is displaced by an amount that depends on the flatness tolerance of each long mirror at each position on which the patterns are projected by each projection optical system. For this reason, a value obtained by subtracting a shift amount from the interval between both projected images is equal to an error produced in the second direction (Y direction) for the position of the patterns formed on the substrate by the pair of projection optical systems, namely the flatness difference between two points of the long mirrors.

In this case, because each separated pattern is projected with half the exposure amount compared to the case in which the patterns are overlappingly projected, it is preferred to have the exposure amount of the projection areas doubled. Moreover, in order to make measurement of the separated patterns easy, it is preferred to shift the imaging position of one of the projection optical systems to avoid overlapping of both projected images.

The mask according to one aspect of the invention has patterns that are projected by a pair of projection optical systems that are spaced from each other in a first direction by a predetermined distance, and the patterns are formed as a plurality of patterns, with the predetermined distance in the first direction between each pattern.

Hence, in the mask of the invention, images projected by each projection optical system are separated from each other (rather than being completely overlapped) by shifting the position (the imaging position) where one of the projection optical systems forms the image on the substrate in the second direction, which is perpendicular to the first direction. Moreover, the value obtained by subtracting a shift amount from the interval between the two separated projection images is equal to a flatness difference between two points of the long mirrors that is produced when the patterns are formed by the pair of projection optical systems onto the substrate during movement of the substrate and the mask.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

A first embodiments of a scanning exposure apparatus, scanning exposure method and a mask of the invention will be described with reference to FIG. 1 through FIG. 9. The description uses an example in which patterns formed on the mask are transferred onto a square glass plate to produce a liquid crystal panel. The description is given here using an example in which the projection optical system is composed of five projection modules. In the following description, the scanning direction of the mask and the glass plate (substrate) is defined as the X direction (first direction), the direction perpendicular to the X direction in the same plane as the mask is defined as the Y direction (second direction), and the direction normal to the mask, namely the optical direction of the exposure beam, is defined as the Z direction.

Figure 1:
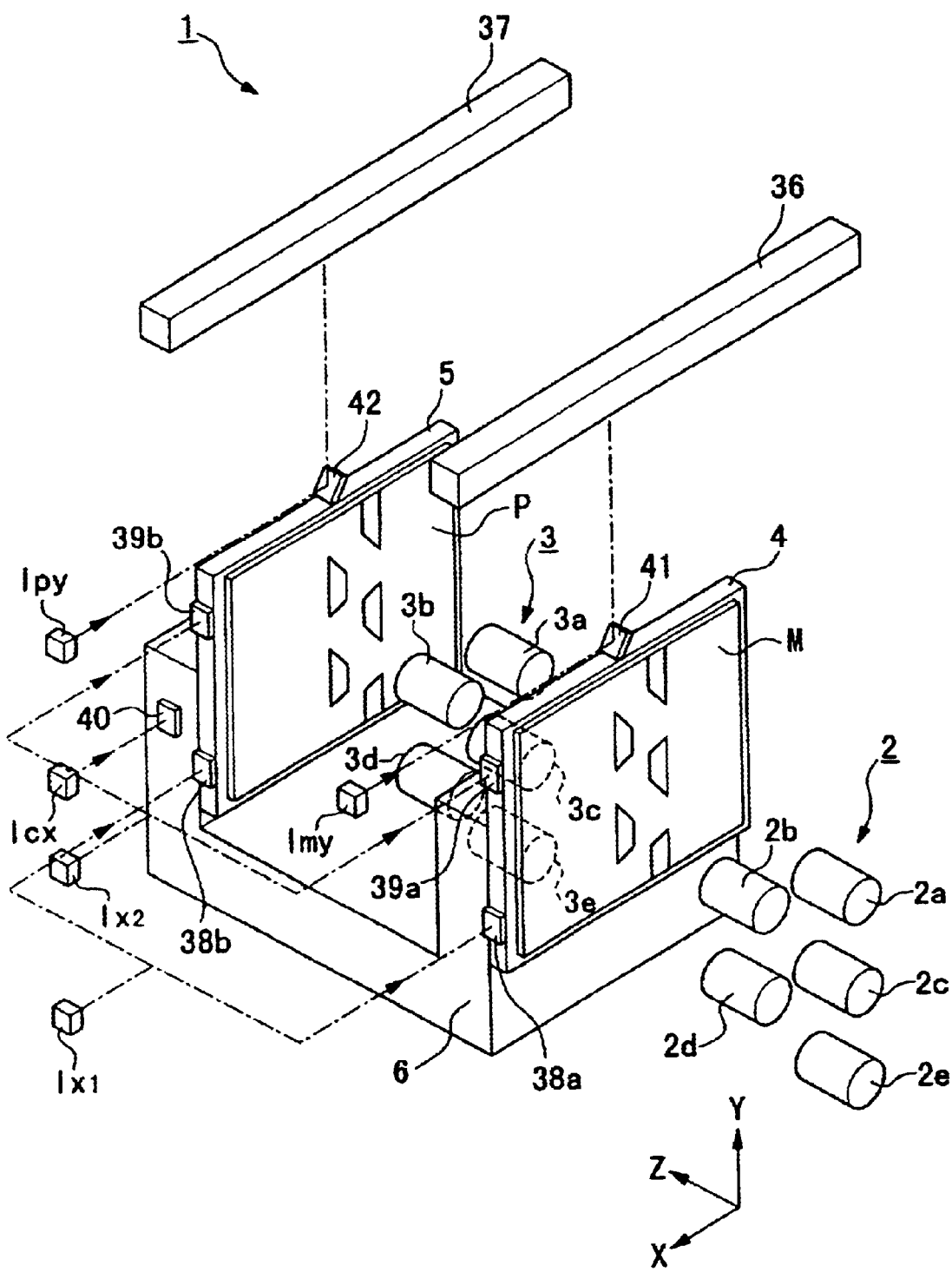
FIG. 1 is a schematic diagram showing a perspective view of the structure of one example of a scanning exposure apparatus to which the invention is applied.

FIG. 1 is an overall perspective view of a scanning exposure apparatus 1 that projects an erect image with a magnification of 1× (i.e., no reduction or enlargement). The scanning exposure apparatus 1 synchronously moves a planar, rectangular mask (reticle) M and a glass plate (substrate) P, and exposes images of patterns formed on the mask M onto the glass plate P. The main components of apparatus 1 include an illumination optical system 2 having a plurality of illumination systems 2a–2e, a projection optical system 3 having a plurality of projection system modules 3a–3e that project patterns on the mask M onto the glass plate P, a mask stage 4 that holds mask M, a substrate stage 5 that holds the glass plate P, and a U-shaped carriage 6 that supports the mask stage 4 and the substrate stage 5, as one unit, on opposite sides of the projection system modules 3a–3e.

Figure 2:
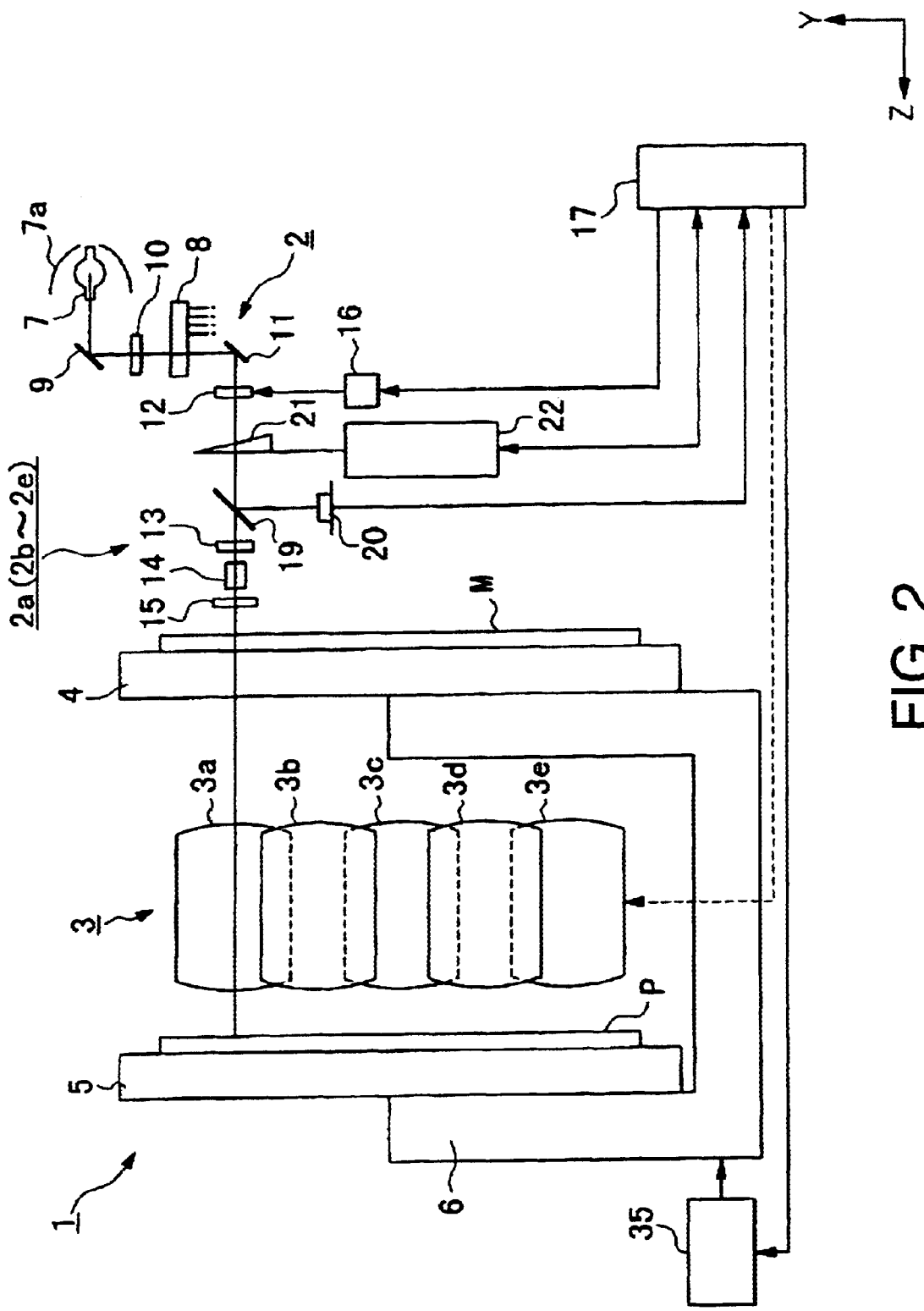
FIG. 2 is a diagram showing the basic structure of the FIG. 1 scanning exposure apparatus.
Figure 3:
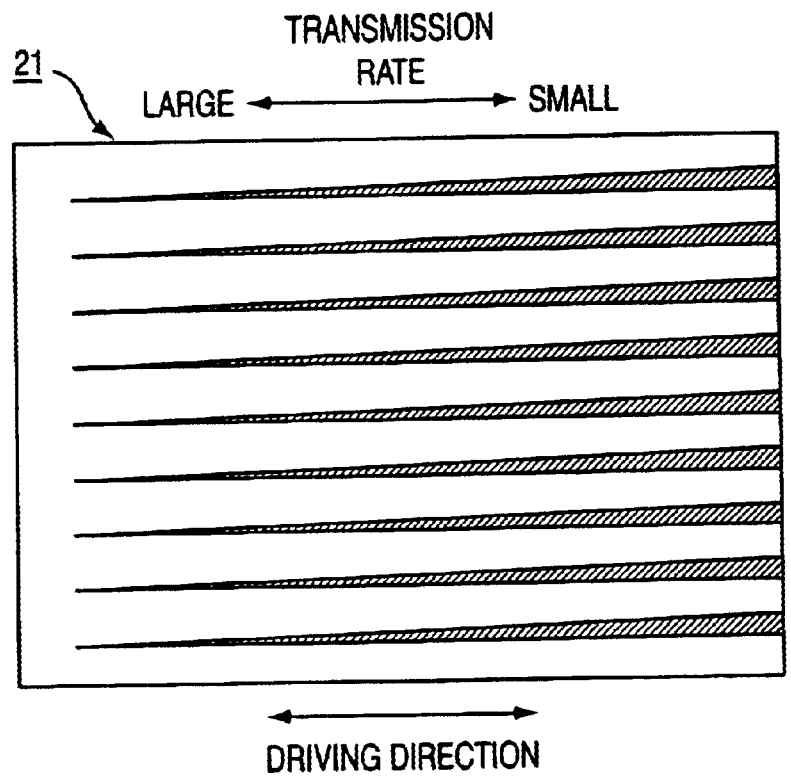
FIG. 3 is a plan view of a filter that is a structural part of the scanning exposure apparatus according to one embodiment of the invention.

The illumination optical system 2 illuminates light rays (exposure beams) emitted from a light source 7 such as a super high pressure lamp shown in FIG. 2 onto the mask M. The illumination optical system includes a relay optical system, a light guide 8 and illumination system modules that are arranged corresponding respectively to the projection system modules 3a–3e (however, in FIG. 2, only one illumination system module corresponding to the projection system module 3a is shown for the sake of simplicity).

The light rays emitted from the light source 7, which is placed at a first focal point of an elliptic mirror 7a, are collected, through the elliptic mirror 7a, at a second focal point of the elliptic mirror 7a. The relay optical system forms images of the light source formed at the second focal point onto an incident surface of the light guide 8. A dichroic mirror 9, a wavelength selection filter 10 and an exposure shutter 12 are arranged in the optical path of the relay optical system. Light rays reflected by the dichroic mirror 9 enter the wavelength selection filter 10 and become light rays with a wavelength (normally containing at least one out of g-, h-, or i-lines) suitable for the projection optical system 3 to execute exposure.

The exposure shutter 12, which is arranged to be able to move freely in and out of the optical path of the light rays, is moved into the optical path during non-exposure time to shield illumination of the light rays onto the mask M. Conversely, the exposure shutter 12 is retracted from the optical path during the exposure time so that the light rays may illuminate the mask M. A shutter driver 16 that moves the exposure shutter 12 into and out of the optical path is attached to the exposure shutter 12, and driving of the shutter driver 16 is controlled by a control apparatus (exposure amount controller) 17. The light guide 8 separates incident light rays into five beams, each of which enters through the reflection mirror 11 to the respective illumination modules 2a–2e.

Each of the illumination modules 2a–2e includes an input optical system and a condenser optical system. In the present embodiment, illumination modules 2b–2e have the same structure as the illumination module 2a, and are arranged with respect to each other with a fixed interval therebetween in the X direction and in the Y direction. The light rays from each of illumination modules 2a–2e are made to illuminate different illumination areas on the mask M.

The input optical system forms secondary light source images having uniform illuminance through the light rays output from the exit surface of the light guide 8. A light quantity adjustment mechanism is provided in the input optical system. The light quantity adjustment mechanism has, on a transparent plate such as one shown in FIG. 3, a filter 21 on which a fluted pattern is made by Cr., etc. and that has a transmission rate that changes linearly within a certain range in the Y direction. Filter 21 is structured in such a manner that any arbitrary transmission rate, or any arbitrary exposure amount, may be achieved by moving the filter in a direction perpendicular to the optical axis by the filter driver 22. Motion of the filter driver 22 is controlled by the controller 17.

Light rays passing through the light quantity adjustment mechanism enter a fly-eye lens 14 after passing through the relay lens 13. The fly-eye lens 14 is provided to make the illuminance uniform, and the secondary light sources are formed on the exit surface side of the fly-eye lens 14. Light rays passing through the fly-eye lens 14 illuminate, with uniform illuminance, the illumination area of the mask M after passing through a condenser lens 15 of the condenser optical system. A light quantity monitoring mechanism also is arranged in the condenser optical system.

The light quantity monitoring mechanism monitors illuminance in the optical path by use of a half mirror 19 that is arranged in the optical path to reflect part of the light rays to a detector 20 that detects the light quantity. The illumination signal detected by detector 20 is output to the controller 17. The controller 17 adjusts the light quantity of the light rays to a predetermined value by controlling the light quantity adjustment mechanism (i.e., by controlling the position of filter 21).

Figure 4:
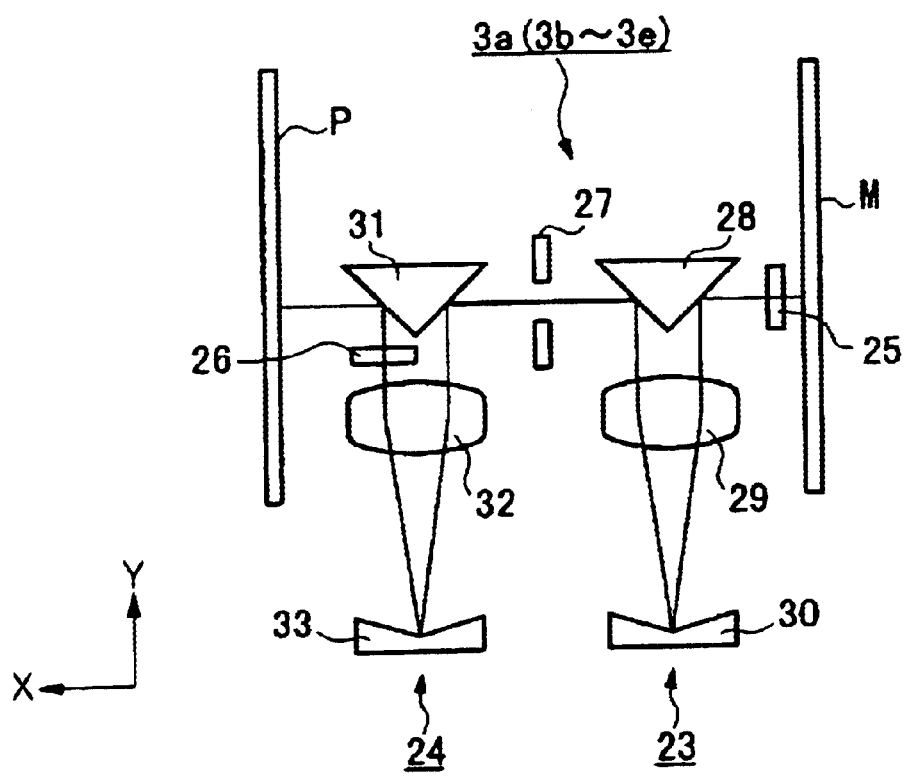
FIG. 4 is a diagram showing the basic structure of a projection optical system module that is part of the scanning exposure apparatus according to one embodiment of the invention.

Light rays passing through the mask M enter each of the respective projection system modules 3a–3e. The patterns on the mask in the illumination area are exposed, as an erect image, onto the glass plate P, which is coated with photoresist. Each of the projection modules 3a–3e is composed of two catadioptric optical systems 23, 24, an image shift mechanism (shifter) 25, an image magnification mechanism 26 (image magnifier), an image rotation mechanism (unrepresented) and a field stop 27, as shown in FIG. 4.

Light rays passing through the mask M first enter the image shift mechanism 25. The image shift mechanism, by making two parallel pieces of glass plates respectively rotate around the Y-axis or the X-axis, for example, shifts a mask image in the X direction or in the Y direction. Light rays passing through the image shift mechanism 25 enter the first catadioptric optical system 23. The catadioptric optical system 23 forms an intermediate image of the mask image and is composed of a right angle prism 28, lens 29 and a concave mirror 30. A field stop 27 is arranged at the position where the intermediate image is formed. The field stop 27 establishes the shape of the projection area on the glass plate P. Light rays passing through the field stop 27 enter the second catadioptric optical system 24.

The catadioptric optical system 24 is composed of a right angle prism 31, lens 32 and a convex mirror 33. In addition, the image magnification mechanism 26 is arranged between the lens 32 and the right angle prism 31 in the optical path of the light rays that have been reflected by the concave mirror 33. Magnification of the mask image may be changed arbitrarily by the image magnification mechanism 26. The image rotation mechanism enables arbitrary rotation of the mask image by rotating the right angle prism 31 around the Z-axis. Driving parts of the image shift mechanism 25, the image magnification mechanism 26 and the image rotation mechanism (unrepresented) are controlled by the controller 17, which enables the independent position adjustment of the image of the mask M for each of the projection system modules 3a–3e.

Figure 5:
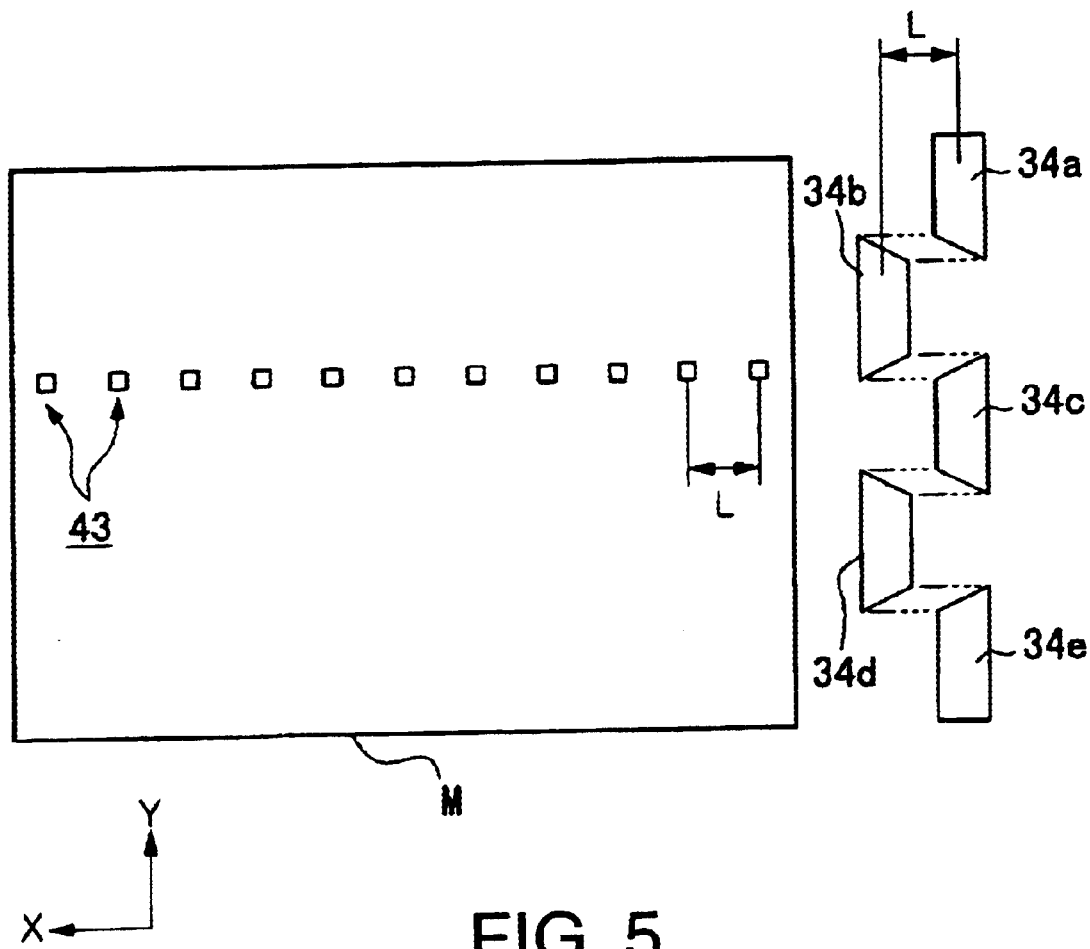
FIG. 5 shows of the positional relationship between the patterns on the mask and the projection areas.

The projection areas 34a–34e of the projection system modules 3a–3e on the glass plate P are shown in FIG. 5. As shown in FIG. 5, each of the projection areas 34a–34e has a trapezoidal shape. Moreover, the projection areas 34a, 34c and 34e are arranged in a first line that is spaced from a second line that includes projection areas 34b, 34d by a distance (predetermined distance) L in the X direction. That is, the center (in the X direction) of areas 34a, 34c and 34e is spaced in the X direction from the center (in the X direction) of areas 34b and 34d by the distance L. Furthermore, the projection areas 34a–34e are, as shown by two-dot chain line, arranged side-by-side (in the Y direction) in such a manner that edge sections of adjacent projection areas are overlapped in the Y direction and the total sum of the width of the projection areas in the X direction is nearly constant. In other words, it is set in such a manner that the exposure amount of scanning exposure in the X direction is uniform.

By providing an overlap section where edges of the projection areas 34a–34e of each of the projection modules 3a–3e mutually overlap in the manner described above, optical aberration change and illuminance change along the Y direction in the connection sections is made to be gradual and smooth. Although the shape of the projection areas 34a–34e in the present embodiment is trapezoidal, other shapes such as a hexagon, a rhombus and a parallelogram may be used as well.

The mask stage 4, which holds the mask M, is supported by the carriage 6 through three fine adjusters (unrepresented). The mask stage 4 finely adjusts, using an X direction fine adjuster, the position of the mask stage 4 in the X direction, and using two Y direction fine adjusters, enables fine adjustment of the position of the mask stage 4 in the Y direction and around the Z-axis.

The substrate stage 5, which holds the glass plate P, compensates for thickness unevenness and tilting of the glass plate P, and at the same time, in order to match the glass plate P with the imaging surface of the mask pattern, the plate stage 5 is supported by the carriage 6 through three or more Z direction fine adjusters (unrepresented). The Z direction fine adjusters are structured in such a manner that fine adjustment (auto focus) in the Z direction and tilt angle adjustment (auto leveling) about the X-axis and about the Y-axis are enabled.

The carriage 6, which is driven by the carriage driver 35, is made to move freely in the X direction on an unrepresented base. The carriage driver 35 is controlled by the controller 17. By scanning the carriage 6 in the X direction through the carriage driver 35, the entire pattern of the mask M is transferred onto the glass plate P.

As shown in FIG. 1, a long mirror 36 for the mask and a long mirror 37 for the substrate are placed above the mask stage 4 and the substrate stage 5, and are anchored respectively on unrepresented frames. Both long mirrors 36, 37 are reflection mirrors extending in the X direction and are arranged in such a manner that the normal lines to the reflection surfaces face in the Y direction. The long mirror 36 for the mask is arranged to face the mask stage 4, while the long mirror 37 for the substrate is arranged to face the substrate stage 5.

Positions and postures of the mask stage 4 and of the substrate stage 5 are detected by five interferometers, Ix1, Ix2, Icx, Imy, and Ipy, and the result of detection is output to the controller 17. The controller 17, based on the output from the interferometers Ix1, Ix2, Icx, Tmy and Ipy, monitors the positions of the mask stage 4 and the substrate stage 5, and causes the mask stage 4 and the substrate stage 5 (and, in turn, the mask M and the glass plate P) to move to desired positions with a high level of accuracy by controlling the fine adjusters and the carriage driver 35.

The differential interferometer Ix1 measures relative position shift of the mask stage 4 and the substrate stage 5 in the X direction. The interferometer Ix1 measures the relative position shift of the mask stage 4 and the substrate stage 5 in the X direction based on the interference between the incident light and the reflected light produced by divided laser beams being reflected by the reflection mirrors 38a, 38b, each of which is provided respectively on the mask stage 4 and on the substrate stage 5.

The differential interferometer Ix2 measures, at a different location in the Y direction, relative position shift of the mask stage 4 and the substrate stage 5 in the X direction. The interferometer Ix2 measures the relative position shift of the mask stage 4 and the substrate stage 5 in the X direction based on the interference between the incident light and the reflected light produced by divided laser beams being reflected by the reflection mirrors 39a, 39b, each of which is provided respectively on the mask stage 4 and on the substrate stage 5.

The interval between the reflection mirrors 38a and 39a that are provided on the mask stage 4 and the interval between the reflection mirrors 38b and 39b that are provided on the substrate stage 5 are set to be equal to each other. Moreover, it is preferred to arrange the positions of the reflection mirrors 38a and 39a on the mask stage 4, and the positions of the reflection mirrors 38b and 39b on the substrate stage 5 to be equidistant from the centers of each stage 4 and 5. Using both of these interferometers Ix1 and Ix2, the amount of relative position shift and the amount of relative rotation about the Z-axis of the mask stage 4 and the substrate stage 5 may be measured.

Length measuring type interferometer Icx measures the position of the carriage 6 in the X direction based on the interference between the incident light and the reflected light produced by laser beams being reflected by the reflection mirror 40 that is provided on the carriage 6.

Length measuring type interferometer Imy measures the displacement in the Y direction of the mask stage 4 by detecting the distance in the Y direction between the mask stage 4 and the long mirror 36 for the mask. The interferometer Imy measures the displacement of the mask stage 4 in the Y direction based on the interference between the incident light and the reflected light produced by laser beams being reflected by the long mirror 36 through reflection mirror 41 that is provided on the mask stage 4.

Similarly, length measuring type interferometer Ipy measures the displacement in the Y direction of the substrate stage 5 by detecting the distance in the Y direction between the substrate stage 5 and the long mirror 37. The interferometer Ipy measures the displacement of the substrate stage 5 in the Y direction based on the interference between the incident light and the reflected light produced by laser beams being reflected by the long mirror 37 through reflection mirror 42 that is provided on the substrate stage 5.

Here, the long mirrors 36 and 37 extend in the scanning direction, and serve as reference surfaces in measuring the displacement in the Y direction of the mask stage 4 and of the substrate stage 5 during exposure. However, the measurement values of the interferometers Imy and Ipy include, in addition to the displacement in the Y direction of the mask stage 4 and the substrate stage 5, errors due to flatness tolerance of the long mirrors 36 and 37. Hence, it is necessary to measure the flatness tolerance of the long mirrors 36 and 37 beforehand and to correct for it during exposure. In the present embodiment, it is sufficient to measure the relative displacement in the Y direction of the mask stage 4 and of the substrate stage 5; hence it is not necessary to measure the flatness of each of long mirrors 36 and 37, but only the difference in flatness of the long mirrors 36 and 37 needs to be measured. Hereafter, the difference in flatness of the long mirrors 36 and 37 measured at the same time by the interferometers Imy and Ipy will simply be called a flatness tolerance (or error) of the long mirrors.

Figure 6A:
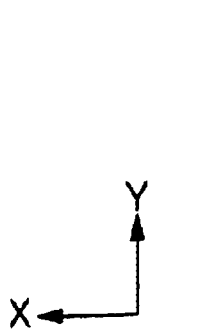
FIG. 6A is an enlargement of the pattern in FIG. 5.
Figure 6B:
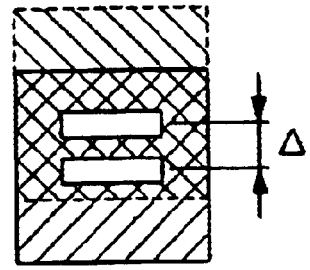
FIG. 6B shows the patterns that are separated and projected.

FIG. 5 shows the mask M used for determining the flatness tolerance of the mirrors 36 and 37. As shown in the figure, a plurality of patterns 43 are formed so as to have their Y direction positions located near the center of the overlapping section of the projection areas 34b and 34c. The patterns 43 also are separated from each other by the same distance (L) as the distance between the two rows consisting of the projection areas 34a, 34c, 34e and the projection areas 34b, 34d. As shown in FIG. 6A, each of the patterns 43 is linear, has a width S in the Y direction, and extends in the X direction.

Figure 7:
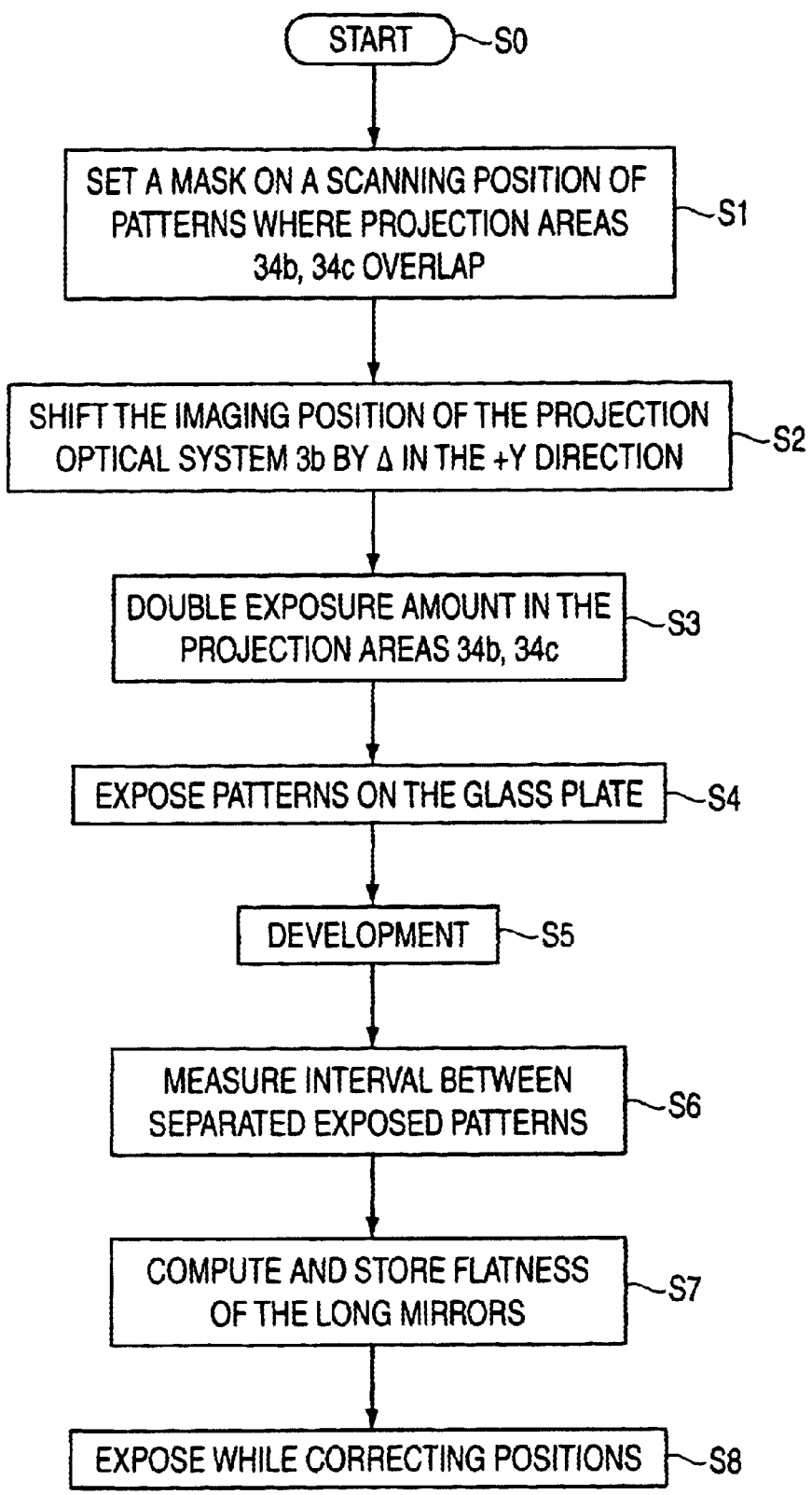
FIG. 7 is a flowchart related to a scanning exposure method of an embodiment of the invention.

Using the scanning exposure apparatus I having the structure described above and the mask M, the steps of obtaining flatness difference (tolerance) of the long mirrors 36 and 37 will be explained based on the flowchart illustrated in FIG. 7. Here, it is assumed that the movement of the mask stage 4 and the substrate stage 5 are to be executed by the controller 17 through the carriage driver 35 and the carriage 6.

After the sequence begins (step S0), the mask M is set at the position such that patterns 43 will be scanned in t e area where the projection areas 34b and 34c overlap (step S1). Next, the imaging position of the pattern 43 on the glass plate P for the projection system module 3b, out of the pair of projection modules 3b and 3c that project the patterns 43, is shifted, by means of the image shift mechanism 25, in the +Y direction by Δ (step S2). The image projected by module 3b and the image projected by module 3c are separated to avoid overlapping by making the distance Δ larger than the line width S of the patterns 43.

Normally the patterns 43 are exposed with an optimum exposure amount by being projected onto the glass plate P twice (i.e., once through each of the projection modules 3b and 3b). However, because the imaging position of the projection system module 3b is shifted, the patterns 43 are projected to a particular position on plate P by only one projection system module, resulting in exposure with half of the optimum amount. For this reason, exposure amount at the projection areas 34b and 34c is set to be double the normal amount by driving the filter 21 through the filter driver 22 in the light quantity adjustment mechanism for each of the illumination system modules 3b and 3c (step S3).

Figure 8:
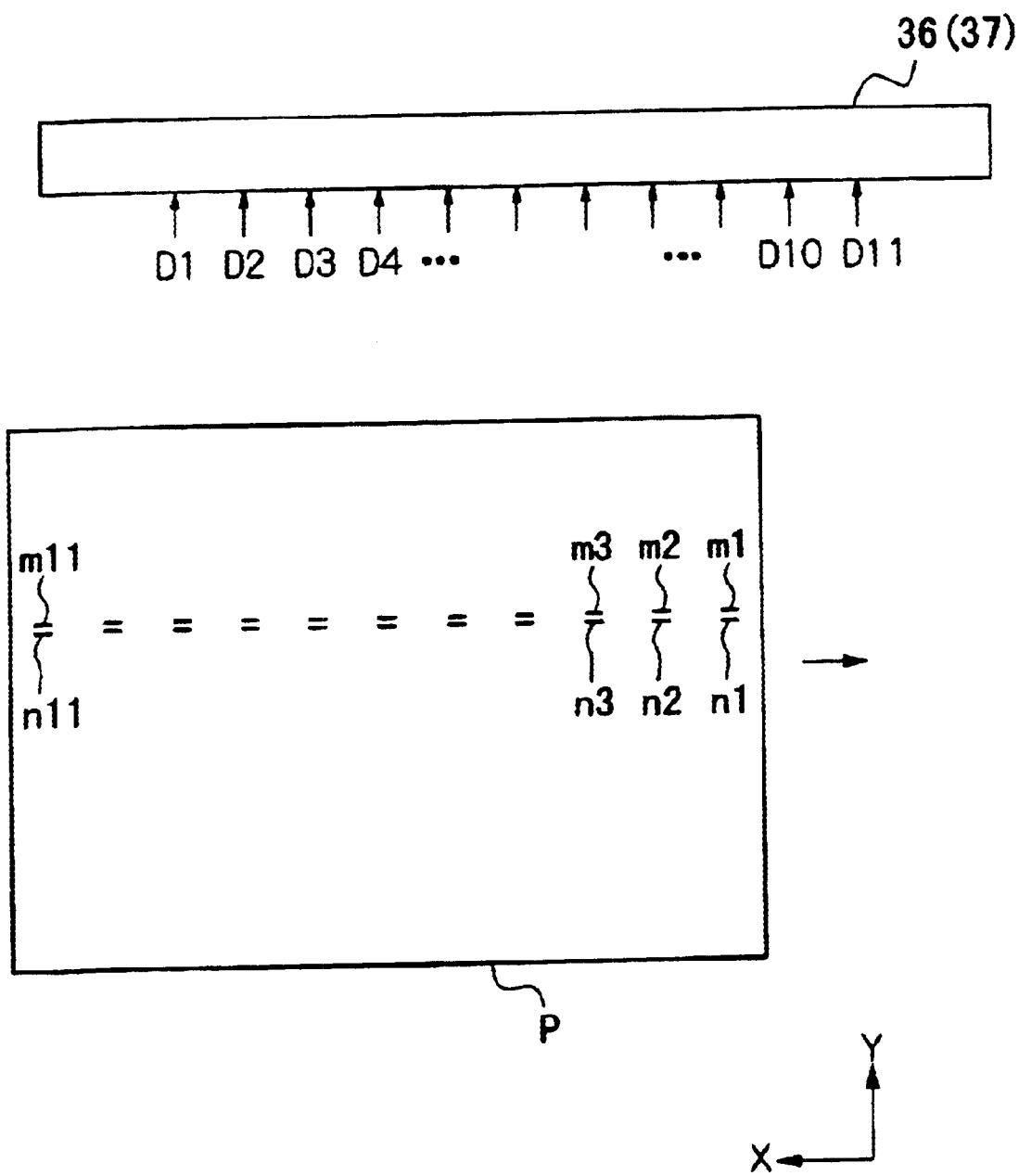
FIG. 8 shows the positional relationship between the patterns projected on the glass plate and the long mirrors.

Next, the carriage 6 is moved from the scanning starting position in the −X direction based on the measurement result of interferometers Ix1, Ix2, Icx, Imy and Ipy, to expose patterns 43 of the mask M onto the glass plate P (step S4). As a result, patterns m1, n1–m11, n11, separated from the patterns 43, are exposed onto the glass plate P, as shown in FIG. 8. Next, the glass plate P is developed (step S5) and the intervals in the Y direction between each pattern 43 that is separated and transferred onto the glass plate P are measured using a SEM (scanning electron microscope) or the like (step S6).

During scanning exposure, fine adjusters in each of stages 4 and 5 are driven to correct displacement in the Y direction of the mask stage 4 and substrate stage 5. For this reason, each pattern 43 would be exposed onto the plate P while being separated by the distance Δ if the reflection surfaces of both long mirrors 36 and 37 was perfectly planar. In reality, the patterns of the mask M are exposed onto the glass plate P with a shift corresponding to the flatness tolerance of respective positions where the laser beams of the interferometers Imy and Ipy are reflected by the long mirrors 36 and 37.

In other words, when the patterns 43 of the mask M are separated and exposed onto the glass plate P as pattern m1 and n1, as shown in FIG. 8, the pattern m1 is exposed onto a position corresponding to the flatness tolerance of the laser beam reflection position D1 in the long mirrors 36 and 37 when the images of the pattern 43 are projected onto the projection area 34b, and the pattern n1 is exposed onto a position corresponding to the flatness tolerance of the laser beam reflection position D2 on the long mirrors 36 and 37 when the image of the patterns 43 are projected onto the projection area 34c. This occurs because adjacent patterns 43 on the mask M are separated from each other by distance L, as are the modules 34b and 34c.

Figure 9:
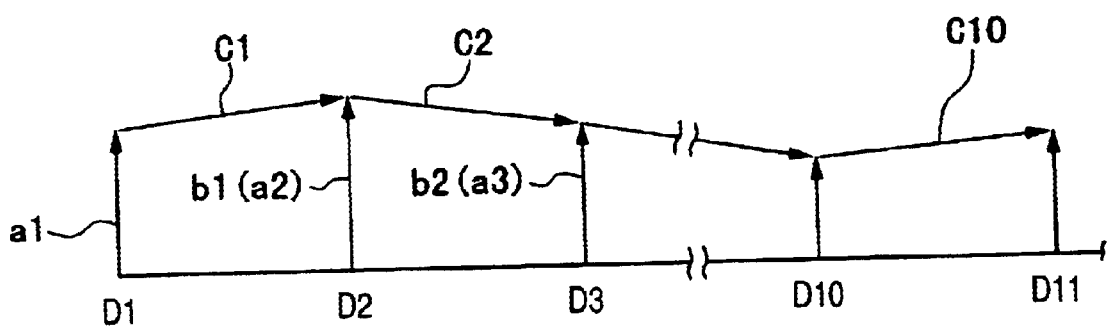
FIG. 9 is an illustration showing the relationship between reflection positions and vectors between reflection positions in the long mirrors.

Here, the flatness tolerance between the reflection position D1 and D2 is obtained by the following equation where a1 denotes a vector component in the Y direction of the long mirrors 36 and 37 at the reflection position D1 when the pattern m1 is exposed and b1 denotes a vector component in the Y direction of the long mirrors 36 and 37 at the reflection position D2 when the pattern n1 is exposed, as shown in FIG. 9:

$$c1 = b1 - a1.$$

Meanwhile, the pattern m1 is exposed onto the glass plate P at a position shifted in the Y direction by a1 and the pattern n1 is exposed at a position shifted in the Y direction by (Δ+b1). Hence, the interval between transferred patterns m1 and n1 becomes (Δ+b1)−a1=Δ+c1. As a result, the value obtained by subtracting shift amount Δ at the projection module 3b from the measured interval between the pattern m1 and n1 is an error in the Y direction generated when the carriage 6 moves the projection system modules 3b and 3c that are arranged in two rows, namely the flatness tolerance c1 between reflection positions D1 and D2 of the long mirrors 36 and 37 at the time of exposure respectively of the patterns 43 onto the glass plate P with exposure beams from the projection system modules 3b and 3c.

Because the placement interval of the patterns 43 on the mask M is the same distance L as the placement interval of the projection system modules 3b and 3c, when an image of the first pattern 43 is projected in the projection area 34c, an image of the second pattern 43 is projected simultaneously and is exposed as pattern m2 onto the position corresponding to the flatness tolerance (vector a2) of the reflection position D2 of the laser beams in the long mirrors 36 and 37. Moreover, with movement of the carriage 6, the image of the second pattern 43 is exposed as pattern n2 on the position corresponding to the flatness tolerance (vector b2+Δ) of the reflection position D3 of the laser beams in the long mirrors 36 and 37. Hence, the value obtained by subtracting shift amount Δ at the projection module 3b from the measured interval between the patterns m2 and n2 is the flatness tolerance c2 between reflection positions D2 and D3 of the long mirrors 36 and 37 at the time of exposure respectively of the second pattern 43 onto the glass plate P with exposure beams from the projection system modules 3b and 3c.

Similarly, the flatness tolerance c3–c10 between reflection positions D3, D4–D10, D11 of the long mirrors 36 and 37 may be obtained by measuring the respective interval for each of patterns m3, n3–n11. As a result, the flatness tolerance MFi of the long mirrors 36 and 37 at the reflection position i is obtained by the equation:

$MFi = c1 + c2 + \ldots + ci$.

In addition, the flatness at points between each of the measured reflection positions may be determined using interpolation such as linear interpolation. Flatness tolerance of the long mirrors 36 and 37 at arbitrary exposure positions may be obtained from the position relationship, which is already known, of the position in the long mirrors 36 and 37 with the mask M (or the glass plate P).

Moreover, by forming the patterns 43 on the mask M over the pattern area in the X direction of the mask and by making all the intervals between the patterns 43 distance L, the flatness tolerance of the long mirrors 36 and 37 may be obtained continuously over the exposure region without interruption. The flatness tolerance obtained by the aforementioned equations may be stored in the controller 17 (step S7).

Next, the circuit pattern on a regular mask is scan exposed onto the glass plate by setting a mask containing an appropriate circuit pattern for mass production and a glass plate respectively on the mask stage 4 and the substrate stage 5, and by moving the carriage 6 relative to the projection system modules 3a–3e. At this time, the fine adjusters provided in each of stages 4 and 5 may be driven to correct the displacement in the Y direction of the mask stage 4 and the substrate stage 5 based on the measurements obtained by interferometers Imy and Ipy, and the flatness tolerance of the long mirrors 36 and 37 (step S8).

The aforementioned sequences to obtain the flatness tolerance of the long mirrors 36 and 37 may be executed during initial operation of installation of the exposure apparatus I or may be executed for each lot of substrates to be exposed (i.e., periodically).

In the scanning exposure apparatus, scanning exposure method and mask of this embodiment of the invention, in which the patterns 43 are formed separated by the distance L, which is the same distance as the interval between placement positions of the projection system modules 3b and 3b, and in which the patterns 43 are exposed by shifting an imaging position of the projection system module 3b, the flatness difference between the long mirror 36 for the mask and the long mirror 37 for the substrate may be obtained easily by measuring the intervals between separated and exposed patterns m1, n1~m11, n11. As a result, it is not necessary to increase the number of measurement axes of the interferometer systems so as to provide a separate interferometer to measure displacement of each stage 4 and 5 at two locations separated in the X direction for the long mirrors 36 and 37. Thus, the invention contributes to cost reduction. Moreover, in the scanning exposure apparatus and the scanning exposure method of this embodiment, the image of the patterns 43 are shifted by the image shift mechanism 25, which is already provided to adjust the imaging characteristics of the projection system module 3b, and therefore it is not necessary to provide a separate shift mechanism, contributing to further cost reduction.

In the embodiment, the flatness tolerance of the long mirrors 36 and 37 is obtained continuously without interruption by forming the patterns 43 on the mask M over the pattern area in the X direction of the mask M with the interval L between patterns 43.

Furthermore, in the scanning exposure apparatus and the scanning exposure method of the invention, because the image position of the projection system module 3b is shifted to avoid overlapping of the patterns m1–m11 and the pattern n1–n11 on the glass plate P, measurement of the interval between patterns is easily accomplished. Moreover, in this embodiment, the exposure amount of the projection areas 34b and 34c are doubled. Hence, even if patterns are shifted and exposed in the overlapped section where the exposure amount originally is to be an optimum amount due to overlapping exposure, both patterns that are separated may be exposed respectively with the optimum exposure amount, and patterns m1–m11 and n1–n11 having a predetermined line width may be obtained.

Figure 10:
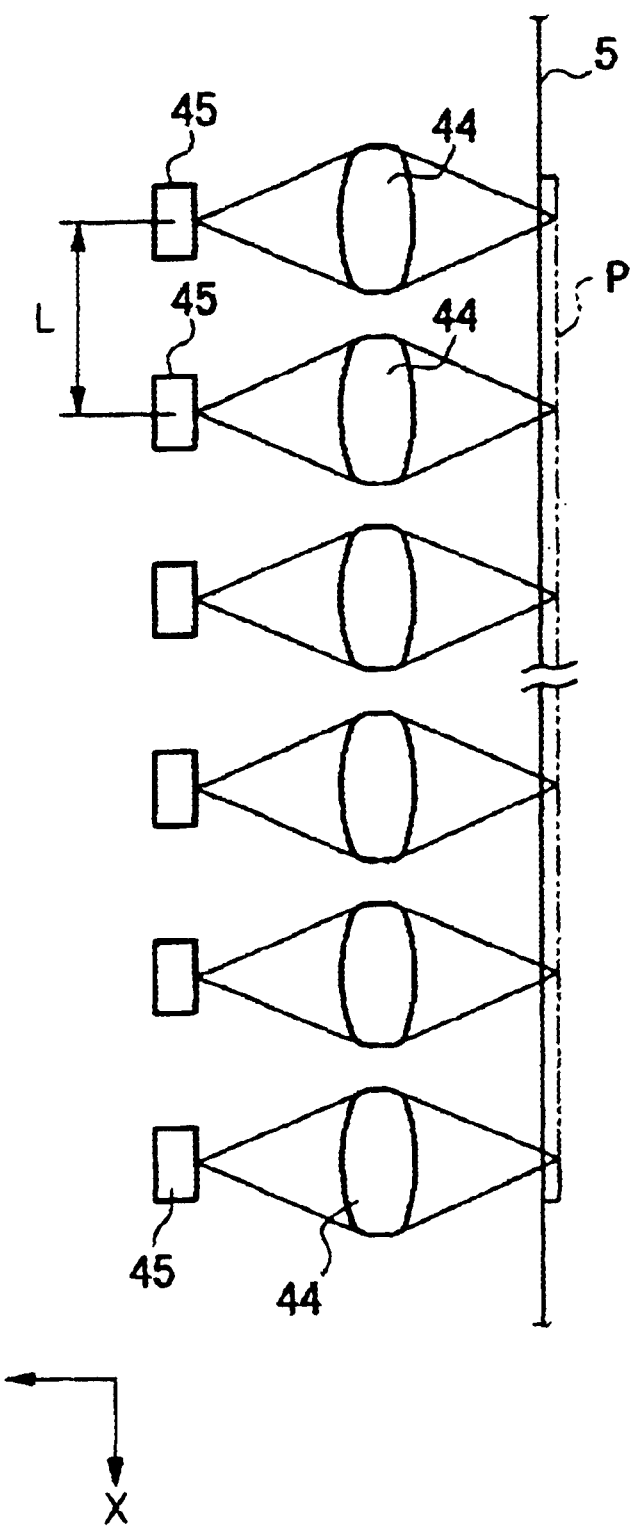
FIG. 10 is a diagram showing a second embodiment of the invention and a cross-section of a plurality of imaging lenses and detectors installed in the substrate stage in pairs.

FIG. 10 illustrates a second embodiment of the scanning exposure apparatus, scanning exposure method and mask of the invention. In FIG. 10, the elements that are the same as the elements in the first embodiment described in FIG. 1 through FIG. 9 will be denoted by the same symbols and the explanation of those elements will be omitted. A difference of the second embodiment from the first embodiment is that a structure is provided to measure images of the patterns 43 with a detector instead of by performing exposure on the glass plate P.

As shown in the figure, in the substrate stage 5, a plurality of imaging lenses 44 and detectors 45 are provided in pairs at positions, separated by distance L along the X direction, enabling reception of both images of separately projected patterns 43. Imaging lenses 44 form images of separately projected images of the patterns 43 respectively on the detectors 45. Detectors 45, which can be, eg., two dimensional CCDs, for example, detect and output to the controller 17 the interval between the images by image processing the images of separately projected patterns 45. The remaining structures are the same as the corresponding structures in the aforementioned first embodiment.

In the scanning exposure apparatus and the scanning exposure method of the second embodiment, in addition to similar functions and effects of the aforementioned first embodiment, the interval between images of the separated patterns 43 may be detected directly. Hence, it is not necessary to provide a separate development process and a measurement process, enabling quick computation of flatness tolerance of the long mirrors 36 and 37, which is desirable.

The present embodiment is structured in such a manner that the imaging position is shifted at the projection system module 3b, but it also may be structured in such a manner that the imaging position is shifted at the projection system module 3b, or that the imaging positions are shifted at both projection system modules 3b and 3b. Moreover, the embodiment is structured in such a manner that the patterns 43 of the mask M are projected in an overlapping section of the projection areas 34b and 34c that correspond to the projection system modules 3b and 3c, but the patterns 43 also may be projected in the overlapping section of other projection areas by changing the position of the patterns 43. In this case, it is sufficient to shift at least one of the imaging positions in a pair of projection system modules corresponding to the projection areas. Moreover, the embodiment is structured in such a manner that the patterns 43 are formed in a row along the X direction on the mask M. However, the patterns 43 may be formed in four rows to correspond to all four overlapping sections of the projection areas 34a–34e. In this case, it is sufficient to shift the imaging position in the Y direction in both projection system modules 3b and 3d, for example, of one row out of the projection type modules 3a–3e. As a result, the flatness of the long mirrors 36 and 37 may be obtained as an average value of the values obtained by a plurality of measurements, which will further improve the measurement accuracy.

Moreover, in the aforementioned embodiment, images of the patterns 43 that are formed by the projection system modules 3b and 3c are shifted to avoid mutual overlapping.

However, part of the images may overlap as long as it is possible to measure the interval between projected images. For example, when patterns 43 are transferred onto the glass plate P with some overlapping, the exposure amount of the overlapped section becomes double that of the non-overlapping section, which causes the line width to be different, which is easily detected.

The substrate of the present embodiment may be not only a glass plate P for use in fabricating liquid crystal devices, but also could be a semiconductor wafer for use in fabricating semiconductor devices, a ceramic wafer for use in fabricating thin film magnetic heads, or an original plate (e.g., synthetic quartz, silicon wafer) of a mask or reticle that is used in exposure apparatus.

The scanning exposure apparatus I can be a wide variety of exposure apparatus such as an exposure apparatus for use in production of liquid crystal display devices that exposes a liquid crystal display device pattern onto a glass plate P, an exposure apparatus for use in production of semiconductor devices that exposes a semiconductor device pattern onto a wafer, and an exposure apparatus for use in production of thin film magnetic heads, CCDs or reticles. Moreover, in the present embodiment, the mask M and the glass plate P are supported in the vertical direction, however, the mask M and the glass plate P alternatively may be supported in the horizontal direction.

The light source 7 can have an emission line (g-line (436 nm), h-line (404.7 nm), i-line (365 nm)) generated by a super high pressure mercury lamp, or it can be a KrF excimer laser (248 nm), an ArF excimer laser (193 nm), an $F_2$ laser (157 nm), a charged particle beam such as an X-ray or an electron beam. For example, when an electron beam is used, thermoelectron-emitting lanthanum hexaborite ($LaB_6$) or tantalum (Ta) may be used as an electron gun. A high frequency wave such as produced by a YAG laser or a semiconductor laser may also be used.

With respect to magnification, the projection system modules 3a–3e may be reduction systems or enlargement systems as well as equal magnitude (unity) systems. The material of the projection system modules 3a–3e can be quartz or fluorite that transmit far ultraviolet rays if far ultraviolet rays such as produced by an excimer laser are used. The projection modules 3a–3e may be of the catadioptric type or of the refraction type optical system (and may use a reflection type mask M) if an $F_2$ laser or an X-ray is used. In addition, an electron optical system made of an electron lens and a deflecting system may be used as the optical systems if an electron beam is used. Here, the optical path where the electron beam passes must be maintained in a vacuum state.

If a linear motor (see U.S. Pat. No. 5,623,853 and U.S. Pat. No. 5,528,118) is used as part of carriage 6 (or as substrate stage 5 and/or mask stage 4 if glass plate P and mask M are driven independent of each other without using the carriage 6), the linear motor can be either an air float type using air bearings or a magnetic levitation type using Lorentz force (electromagnetic force). Moreover, the carriage 6 (or the substrate stage 5 or mask stage 4 in some cases) may be of a type that moves along a guide or it may be a guideless type that requires no guides.

The carriage driver 35 of the carriage 6 (or a driver of each of stages 4 and 5 in some cases), may be a flat motor that drives the carriage 6 (or each of stages 4 and 5 in some cases) by electromagnetic force generated by a magnetic unit (permanent magnet) having magnets arranged in two dimensions that faces an armature unit having coils arranged in two dimensions. In this case, one of the magnetic unit or the armature unit is connected to the carriage 6 (or to stages 4 and 5 in some cases), and the other is installed on the movement surface side (base) of the carriage 6 (or on each of stages 4 and 5 in some cases).

Reaction force that is generated by the movement of the carriage 6 (or by movement of the mask stage 4 or the substrate stage 5 in some cases) may be mechanically removed through the floor (ground) using a frame member that prevents transmission of reaction forces to the projection optical system 3 (projection system module 3a–3e) as described in U.S. Pat. No. 5,528,118 or in Japanese Laid Open Pat. Publication No. 8-330224 (and in U.S. Pat. No. 5,874,820). The invention also may be applied to an exposure apparatus having such structure.

As described above, the scanning exposure apparatus 1, which is a substrate processing apparatus according to one embodiment of the invention, is produced by assembling various subsystems containing various structural elements in such a manner that a predetermined mechanical accuracy, electrical accuracy and optical accuracy are maintained. In order to ensure such accuracy, adjustment to achieve optical accuracy of the various optical systems, adjustment to achieve mechanical accuracy of the various mechanical systems, and adjustment to achieve electrical accuracy of the various electrical systems are conducted before and after assembly. Assembly process from various subsystems to the exposure apparatus includes mutual mechanical connection, electrical circuit wiring connection and piping connection of pneumatic circuits. The process to assemble the individual subsystems are completed before starting the process of assembling the various subsystems into the exposure apparatus. Upon completion of assembly of the various subsystems to the exposure apparatus, comprehensive adjustment is conducted to ensure desired accuracy for the entire exposure apparatus. Production of the exposure apparatus is preferably executed in a clean room where temperature and cleanliness are controlled.

Figure 11:
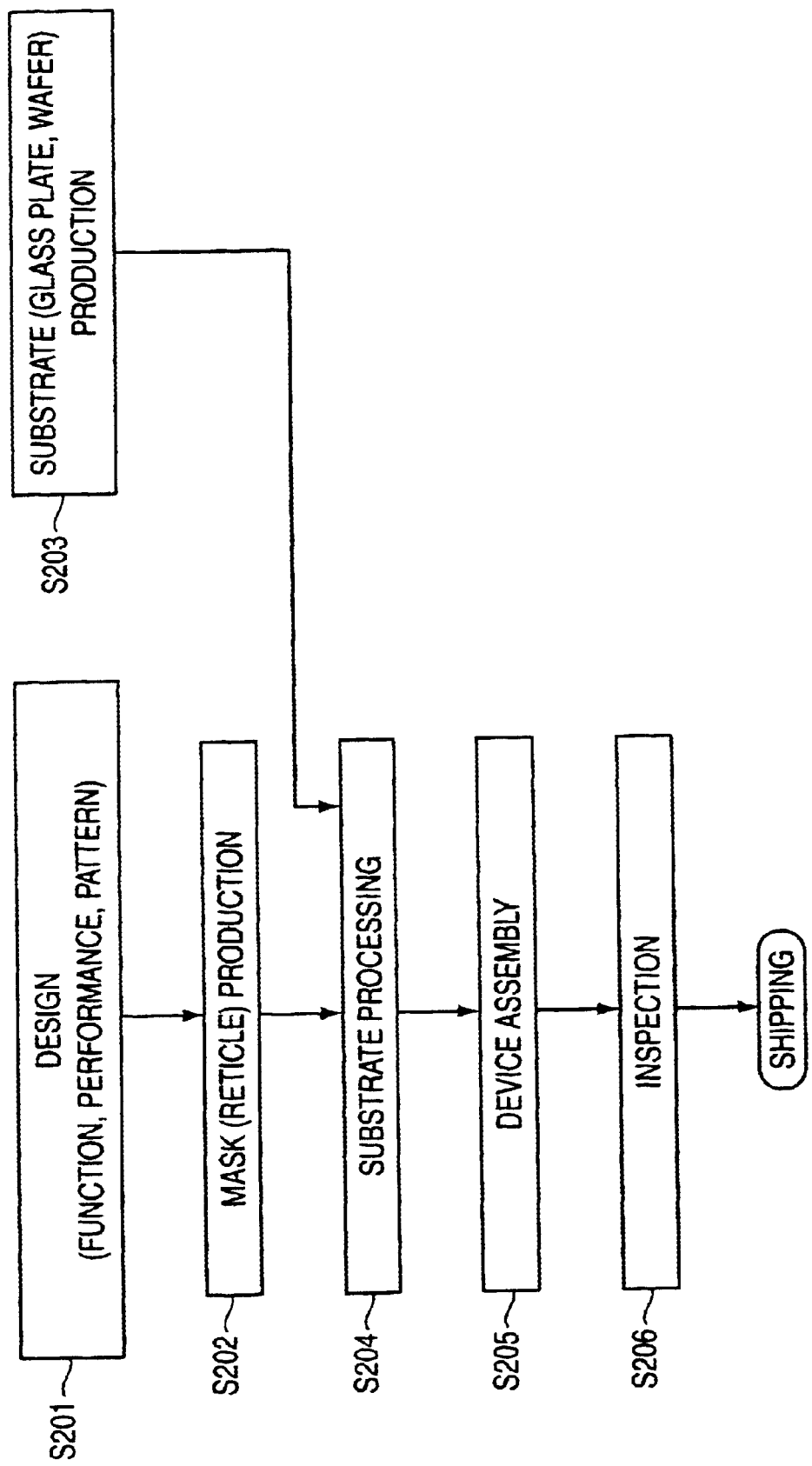
FIG. 11 is a flowchart showing an example of a process for manufacturing liquid crystal display devices.

A production process of devices such as liquid crystal display devices and semiconductor devices includes, as shown in FIG. 11, a step 201 in which function and performance design of the liquid crystal display device and the like is performed. Then, a step 202 for producing a mask M (reticle) based on the design step, and a step 203 for producing a substrate such as a glass plate from quartz and the like or producing a wafer from silicon material is performed. Then, a step 204 for exposing the patterns of the mask M onto the substrate using the scanning exposure apparatus of the aforementioned embodiment is performed, followed by a step 205 of assembling a liquid crystal device and the like (in the case of a wafer, this includes a dicing step, a bonding step, and a packaging step). Finally, a step 206 for inspection is performed.

As described above, a scanning exposure apparatus of one aspect of the invention is structured in such a manner that a pair of projection optical systems, in which at least portions of the projection areas where the patterns are projected onto a substrate are overlapping, are arranged so as to be separated by a predetermined interval in a first direction, and a shifter shifts the pattern image to be overlappingly exposed onto the plate in a second direction perpendicular to the first direction. As a result, in the scanning exposure apparatus, the flatness error of the long mirrors is easily obtained by measuring the interval between separated and exposed patterns. This eliminates the need for increasing the number of measurement axes of the interferometer systems to be used for the long mirrors, which reduces cost.

The scanning exposure apparatus can include the shifter in at least one of the pair of the projection optical systems.

As a result, the scanning exposure apparatus is advantageous in that images of the patterns projected by at least one of the pair of projection optical systems is shifted.

The scanning exposure apparatus can be structured in such a manner that the images projected by the pair of projection optical systems are shifted to avoid overlapping. As a result, the scanning exposure apparatus is advantageous in that intervals between the patterns are easily measured.

The scanning exposure apparatus can include an exposure amount controller that changes the exposure amount during exposure of the patterns onto the substrate. As a result, the scanning exposure apparatus is advantageous in that both separated patterns are exposed respectively with an optimum exposure amount so that patterns having a predetermined line width are obtained.

Another aspect of the invention relates to a scanning exposure method in which at least a portion of the projection areas where patterns are projected onto a substrate are overlapping, and during the time of exposure onto the substrate using a pair of projection optical systems that are separated from each other by a predetermined interval in the first direction, the images of the pattern that is exposed onto the substrate overlappingly are shifted in the second direction. As a result, in this scanning exposure method, the flatness error of the long mirrors is easily obtained by measuring the interval between separated and exposed patterns, eliminating a need to increase the number of measuring axes of the interferometer(s) being used for the long mirrors, and contributing to cost reduction.

Preferably the images projected by the pair of projection optical system are shifted to avoid overlapping. As a result, the scanning exposure method has a merit in that the interval between patterns may be measured easily.

Preferably the exposure amount during exposure of the patterns onto the substrate is changed due to the shifting of the projected images. As a result, the scanning exposure method has a merit in that both of the separated patterns are exposed with an optimum exposure amount and therefore the patterns having a predetermined line width are obtained.

According to another aspect of the invention, a mask is provided having a plurality of patterns that are separated from each other in the first direction by the same distance by which a pair of projection optical systems are separated from each other in the first direction. As a result, the mask has a merit in that flatness error of the long mirrors is easily obtained by measuring the intervals between separated and exposed patterns that are formed on a substrate.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A scanning exposure apparatus in which images of a pattern are transferred onto a substrate while the substrate is moved in a first direction, comprising:

at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other; and a shifter that shifts the location of at least one of the projection areas in the second direction to dislocate an amount of an overlap of the projection areas.

2. The scanning exposure apparatus of claim 1, wherein the shifter is disposed in at least one of the projection systems of the pair of projection systems.

3. The scanning exposure apparatus of claim 1, wherein the shifter shifts the at least one projection area in the second direction by an amount that is greater than a width of the pattern in the second direction.

4. The scanning exposure apparatus of claim 1, further comprising a substrate stage that holds the substrate, and a detector mounted on the substrate stage to receive the images of the pattern when the shifter shifts the at least one projection area in the second direction.

5. The scanning exposure apparatus of claim 1, wherein the pair of projection systems are projection optical systems.

6. The scanning exposure apparatus of claim 1, wherein the pattern is formed on a mask.

7. A scanning exposure apparatus in which images of a pattern are transferred onto a substrate while the substrate is moved in a first direction, comprising:

at least a pair f projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other;

a shifter that shifts the location of at least one of the projection areas in the second direction; and a substrate stage that holds the substrate, and a controller that determines a flatness error of planar mirror included in a position control system of the substrate stage based on positions of the projection areas formed by the pair of projection systems when the shifter shifts the at least one projection area in the second direction.

8. The scanning exposure apparatus of claim 7, wherein the controller controls movement of the substrate stage during a scanning exposure operation based on the determined flatness error.

9. A scanning exposure apparatus in which images of a pattern are transferred onto a substrate while the substrate is moved in a first direction, comprising:

at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other; and a shifter that shifts the location of at least one of the projection areas in the second direction, wherein the shifter shifts the at least one projection area such that the projection areas do not overlap each other.

10. The scanning exposure apparatus of claim 9, further comprising an exposure amount controller that changes an exposure amount during exposure of the images of the pattern onto the substrate when the shifter shifts the at least one projection area in the second direction.

11. A scanning exposure apparatus in which images of a pattern are transferred onto a substrate while the substrate is moved in a first direction, comprising:

at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other;

a shifter that shifts the location of at least one of the projection areas in the second direction; and an exposure amount controller that changes an exposure amount during exposure of the images of the pattern onto the substrate when the shifter shifts the at least one projection area in the second direction.

12. The scanning exposure apparatus of claim 11, wherein the shifter shifts the at least one projection area in the second direction by an amount that is greater than a width of the pattern in the second direction.

13. A scanning exposure apparatus in which images of a pattern are transferred onto a substrate while the substrate is moved in a first direction, comprising:

at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other;

a shifter that shifts the location of at least one of the projection areas in the second direction;

a substrate stage that holds the substrate, and a detector mounted on the substrate stage to receive the mages of the pattern when the shifter shifts the at least one projection area in the second direction; and a controller that receives signals output by the detector and that determines a flatness error of planar mirrors included in a position control system of the substrate stage based on the output signals.

14. The scanning exposure apparatus of claim 13, wherein the controller controls movement of the substrate stage during a scanning exposure operation based on the determined flatness error.

15. In a scanning exposure method in which images of a pattern are transferred onto a substrate, while the substrate is moved in a first direction, the transfer being performed by at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other, the method including the step of:

shifting at least one of the projection areas in the second direction to dislocate an amount of an overlap of the projection areas.

16. The scanning exposure method of claim 15, wherein the substrate is held by a substrate stage, the method further comprising the step of receiving the images of the pattern with a detector mounted on the substrate stage when the at least one projection area is shifted in the second direction.

17. The scanning exposure method of claim 15, wherein the at least one projection area is shifted in the second direction by an amount that is greater than a width of the pattern in the second direction.

18. The scanning exposure method of claim 15, wherein the shifting step is performed when a mask having a plurality of patterns spaced from each other in the first direction by the predetermined distance is being moved in the first direction.

19. The scanning exposure method of claim 18, further comprising the step of determining a flatness error of planar mirrors included in a position control system that is used to control relative positions of the mask and the substrate during a scanning exposure operation based on positions of the projection areas formed by the pair of projection systems when the at least one projection area is shifted in the second direction.

20. The scanning exposure method of claim 19, further comprising the step of transferring a circuit pattern from a circuit-pattern-containing mask onto the substrate while controlling movement of the circuit-pattern-containing mask and the substrate based on the determined flatness error.

21. The scanning exposure method of claim 20, further comprising the step of producing at least one circuit device from the exposed substrate.

22. In a scanning exposure method in which images of a pattern are transferred onto a substrate, while the substrate is moved in a first direction, the transfer being performed by at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other, the method including the step of:

shifting at leas one of the projection areas in the second direction, wherein the at least one projection area is shifted such that the projection areas formed by the pair of projection systems do not overlap each other.

23. The scanning exposure method of claim 22, further comprising the step of changing an exposure amount during exposure of the pattern onto the substrate when the at least one projection area is shifted in the second direction.

24. In scanning exposure method in which images of a pattern are transferred onto a substrate, while the substrate is moved in a first direction, the transfer being performed by at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other, the method including the steps of:

shifting at least one of the projection areas in the second direction; and changing an exposure amount during exposure of the pattern onto the substrate when the at least one projection area is shifted in the second direction.

25. The scanning exposure method of claim 24, wherein the at least one projection area is shifted in the second direction by an amount that is greater than a width of the pattern in the second direction.

26. In a scanning exposure method in which images of a pattern are transferred onto a substrate, while the substrate is moved in a first direction, the transfer being performed by at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other, wherein the substrate is held by a substrate stage, the method including the steps of:

shifting at least one of the projection areas in the second direction;

receiving the images of the pattern with a detector mounted on the substrate stage when the at least one projection area is shifted in the second direction; and determining a flatness error of planar mirrors included in a position control system of the substrate stage based on output signals of the detector.

27. The scanning exposure method of claim 26, further comprising the step of controlling movement of the substrate stage during a scanning exposure operation based on the determined flatness error.

28. In a scanning exposure method in which images of a pattern are transferred onto a substrate, while the substrate is moved in a first direction, the transfer being performed by at least a pair of projection systems, the pair of projection systems are spaced from each other by a predetermined distance in the first direction, the pair of projection systems also are offset from each other in a second direction, perpendicular to the first direction, such that at least portions of projection areas formed by each of the pair of projection systems onto the substrate overlap each other, wherein the substrate is held by a substrate stage, the method including the steps of:

shifting at least one of the projection areas in the second direction; and determining a flatness error of planar mirrors included in a position control system of the substrate stage based on positions of the projection areas formed by the pair of projection systems when the at least one projection area is shifted in the second direction.

29. The scanning exposure method of claim 28, further comprising the step of controlling movement of the substrate stage during a scanning exposure operation based on the determined flatness error.

* * * * *